(12) United States Patent
Rajapurkar et al.

(10) Patent No.: US 11,640,205 B2
(45) Date of Patent: May 2, 2023

(54) DEVICE THAT CONVEYS HAPTIC FEEDBACK, AND COMPONENT COMPRISING THE DEVICE

(71) Applicant: TDK Electronics AG, Munich (DE)

(72) Inventors: Aditya Rajapurkar, Graz (AT); Roman Puchleitner, St. Stefan (AT); Daniel Neuwirth, Vilshofen (DE); Maximillian Prall, Deutschlandsberg (AT)

(73) Assignee: TDK Electronics AG, Munich (DE)

( * ) Notice: Subject to any disclaimer, the term of this patent is extended or adjusted under 35 U.S.C. 154(b) by 331 days.

(21) Appl. No.: 16/630,306

(22) PCT Filed: Nov. 21, 2017

(86) PCT No.: PCT/EP2017/079883
§ 371 (c)(1),
(2) Date: Jan. 10, 2020

(87) PCT Pub. No.: WO2019/020205
PCT Pub. Date: Jan. 31, 2019

(65) Prior Publication Data
US 2021/0365118 A1   Nov. 25, 2021

(30) Foreign Application Priority Data
Jul. 26, 2017   (AT) ............................ GM50142/2017

(51) Int. Cl.
*G06F 3/01*        (2006.01)
*H01L 41/047*   (2006.01)
(Continued)

(52) U.S. Cl.
CPC .......... *G06F 3/016* (2013.01); *H01L 41/0471* (2013.01); *H01L 41/053* (2013.01);
(Continued)

(58) Field of Classification Search
CPC ... G06F 3/016; G06F 3/0414; H01L 41/0471; H01L 41/053; H01L 41/0825;
(Continued)

(56) References Cited

U.S. PATENT DOCUMENTS

| | | | | |
|---|---|---|---|---|
| 2,386,279 A | * | 10/1945 | Tibbetts | ................. H04R 17/04 29/25.35 |
| 2,895,062 A | * | 7/1959 | Abbott | ................... H04R 15/00 310/369 |

(Continued)

FOREIGN PATENT DOCUMENTS

| | | |
|---|---|---|
| CA | 2996919 A1 | 4/2017 |
| CN | 204167367 U | 2/2015 |

(Continued)

OTHER PUBLICATIONS

Notice of Reasons for Rejection in Japanese Patent Application No. JP 2019-570535, dated Jan. 5, 2021 (6 pages).

(Continued)

*Primary Examiner* — Quan Zhen Wang
*Assistant Examiner* — Mancil Littlejohn, Jr.
(74) *Attorney, Agent, or Firm* — Nixon Peabody LLP (57) ABSTRACT

A device including a piezoelectric actuator that can detect the actuation force and provide haptic feedback. The longitudinal extension of the actuator, generated for this purpose, can be reinforced in the desired direction by a deformable metal sheet. The deformable metal sheet is adhered on and has a borehole for pressure equalization.

14 Claims, 4 Drawing Sheets

(51) Int. Cl.
  *H01L 41/053* (2006.01)
  *H01L 41/08* (2006.01)
  *H03K 17/96* (2006.01)

(52) U.S. Cl.
  CPC ....... *H01L 41/0825* (2013.01); *H03K 17/964* (2013.01); *H01H 2215/052* (2013.01); *H03K 2217/9651* (2013.01); *H03K 2217/96062* (2013.01)

(58) Field of Classification Search
  CPC ............... H01L 41/083; H01L 41/1876; H01L 41/0833; H03K 17/964; H03K 2217/96062; H03K 2217/9651; H01H 2215/052
  See application file for complete search history.

(56) References Cited

U.S. PATENT DOCUMENTS

| | | | |
|---|---|---|---|
| 5,276,657 A | | 1/1994 | Newnham |
| 5,729,077 A | * | 3/1998 | Newnham ............... H02N 2/043 310/369 |
| 5,804,906 A | | 9/1998 | Tsutsumi |
| 6,465,936 B1 | * | 10/2002 | Knowles ................ H02N 2/043 310/328 |
| 6,798,122 B1 | | 9/2004 | Howarth et al. |
| 6,798,888 B1 | * | 9/2004 | Howarth ................... H04R 1/44 181/149 |
| 2002/0109433 A1 | | 8/2002 | Rayner |
| 2005/0057123 A1 | | 3/2005 | Deng |
| 2006/0028095 A1 | | 2/2006 | Maruyama |
| 2009/0088710 A1 | * | 4/2009 | Hoffman ................. A61M 1/78 604/323 |
| 2009/0303839 A1 | * | 12/2009 | Narayanan ............. H04R 17/00 367/164 |
| 2011/0127881 A1 | | 6/2011 | Howarth |
| 2015/0187349 A1 | | 7/2015 | Schafer |
| 2016/0023245 A1 | | 1/2016 | Zadesky |
| 2019/0067552 A1 | | 2/2019 | Franz |
| 2019/0384403 A1 | * | 12/2019 | Khoshkava ........... B06B 1/0666 |

FOREIGN PATENT DOCUMENTS

| | | | | |
|---|---|---|---|---|
| DE | 102015117262 A1 | | 4/2017 | |
| EP | 2315101 A1 | * | 4/2011 | ............. G04C 3/002 |
| EP | 2315101 A1 | | 4/2011 | |
| EP | 2434555 A1 | | 3/2012 | |
| JP | H02-246248 A | | 10/1990 | |
| JP | H06-338640 A | | 12/1994 | |
| JP | 2000-502210 A | | 2/2000 | |
| JP | 2006-048302 A | | 2/2006 | |
| JP | 2006-129625 A | | 5/2006 | |
| JP | 2012-203195 A | | 10/2012 | |
| JP | 2015-527724 A | | 9/2015 | |
| JP | 2017-004240 A | | 1/2017 | |
| JP | 2018-531512 A | | 10/2018 | |
| WO | WO 97/22154 A1 | | 6/1997 | |
| WO | WO 2017/060011 A1 | | 4/2017 | |

OTHER PUBLICATIONS

International Search Report corresponding to International Patent Application No. PCT/EP2017/079883, dated Mar. 28, 2018, with English translation (7 pages).
Written Opinion of International Searching Authority corresponding to International Patent Application No. PCT/EP2017/079883, dated Mar. 28, 2018, with English translation (14 pages).

* cited by examiner

DEVICE THAT CONVEYS HAPTIC FEEDBACK, AND COMPONENT COMPRISING THE DEVICE

CROSS-REFERENCE TO RELATED APPLICATIONS

This application is a U.S. National Stage of International Application No. PCT/EP2017/079883, filed Nov. 21, 2017, which claims the benefit of Austria Patent Application No. GM50142/2017, filed Jul. 26, 2017, both of which are incorporated herein by reference in their entireties.

The present invention relates to a component and a device for generating active haptic feedback. This involves a device configured to generate feedback to a user when the latter exerts a force on the component. Such a component can be used for example in a knob, e.g. in an actuation knob for instruments. The component can generate the active haptic feedback for example in order to communicate to a user the fact that settings carried out by the user are successfully implemented by the component.

Conversely, components can also give active haptic feedback; by way of example, cellular phones can generate vibration alerts. Tactile displays for mobile electronic devices such as notebooks, etc. are also known. The haptic feedback can also convert the strength of forces or the constitution of surfaces or the stiffness or elasticity of materials into a tactilely perceptible sensation.

It is an object of the present invention to specify an improved device for generating active haptic feedback.

This object is achieved by means of a device according to the present claim 1. Advantageous configurations of the invention are evident from further claims.

A device for generating active haptic feedback is specified. The feedback is referred to as active feedback since it is generated by the device itself. The feedback is referred to as haptic feedback since a user can perceive it via his/her sense of touch.

The device comprises a piezoelectric actuator for generating feedback in the form of a haptically perceptible deflection. The actuator comprises a flat piezoelectric main body having approximately plane-parallel main surfaces. First and second actuator electrodes are provided in the main body, and a piezoelectric deflection of the piezoelectric actuator can be effected by way of said actuator electrodes.

The main body is configured such that it identifies a force exerted on the main body. The exerted force is converted into an electrical signal by a piezoelectric element. Said electrical signal can be applied to the actuator electrodes directly or, if appropriate, after having been amplified.

If a voltage is applied to the actuator electrodes, then the main body generates a linear expansion. The linear expansion can take place perpendicularly to the normal, wherein the normal is perpendicular to the main surface of the main body. Such a change in length is also referred to as transverse contraction. In this case, the direction of the linear expansion is dependent on the polarity of the applied voltage and on the polarization of the piezoelectric material.

The change in length of the entire actuator preferably takes place parallel to the exerted force, that is to say along a normal to a main surface of the actuator.

Since a transverse contraction of the main body in the xy plane is poorly perceptible to a user who exerts a force parallel to the normal, the device is advantageously configured to convert changes in length of the main body along a direction perpendicular to the normal into a linear expansion of the actuator parallel to the normal.

The conversion takes place by virtue of the fact that a truncated-cone-shaped metal sheet is secured on one or both main surfaces of the main body, in the case of which metal sheet the truncated "cone vertexes" each face away from the main body. Such a metal sheet is also referred to hereinafter as a cymbal-shaped element.

The cymbal-shaped element is configured to transform a linear expansion of the main body vertically with respect to the normal into a change in length parallel to the normal. The cymbal-shaped element can furthermore serve to amplify a change in length of the main body parallel to the normal which takes place on account of the transverse contraction of the main body. The frustoconically bent or shaped metal sheet can take up a transverse contraction and in so doing deforms in the desired direction, namely parallel to the normal. In this case, this deformation can turn out to be greater than the piezoelectric deflection in the same direction. A well perceptible change in length of the entire device is therefore brought about with a respective cymbal-shaped element on both main surfaces of the main body.

In order that the metal sheet of the cymbal-shaped element is appreciably deformable elastically under actuator influence, it can have a typical thickness which e.g. in the case of titanium is in the range of between 0.1 and 0.4 mm.

The cymbal-shaped element can have a flat edge region, which bears on one of the main surfaces of the main body and is secured there. The securing is carried out by an adhesive, preferably on the basis of an epoxy-containing adhesive.

A cavity is enclosed below the cymbal-shaped element, in which cavity an excess pressure could form after the placement of the cymbal-shaped element or at the latest during thermal curing of the adhesive (e.g. at 150° C.). Said excess pressure in the case of the could escape through the still soft adhesive layer and lead to blistering there. In order to avoid this, the cymbal-shaped element is provided with a hole. The cavity enclosed below the cymbal-shaped element communicates with the surroundings via said hole, such that pressure equalization can take place. Without excess pressure, however, blistering is largely avoided.

Comparative experiments have shown that the hole also has no adverse effects whatsoever on the behavior of the actuator. An advantage of blistering being prevented is an improved durability and hence a higher reliability of the actuator. The adhesive bonding is more durable without enclosed blisters.

The actuator is advantageously fixed by way of the truncated cones of the two cymbal-shaped elements between a base and a securing plate. The securing plate in turn is connected to the base and is fixed by means of a prestress. The latter can act as tensile or compressive stress and be set e.g. by way of springs in each case.

In one embodiment, the actuation plate is configured as a membrane. The membrane is fitted such that it fixes the cymbal-shaped elements and thus also the main body with a prestress acting in the direction of the base at the base. Consequently, the membrane also functions as means which exerts thereon a tensile or compressive stress in the direction of the base.

In the other embodiment, the actuation plate is oriented parallel to the surface of the main body and thus parallel to the base, bears on the cover surface of the upper cymbal-shaped element and is preferably freely movable relative to the actuation plate. The actuation plate projects beyond the main body at at least two sides, better at all sides, and is connected to the base in the projecting region by way of springs, wherein the springs are under prestress. This ensures that a pressure acting on the actuation plate, for example a user's finger pressure, is reliably picked up and at least the force component acting parallel to the normal is transmitted to the main body. The actuation plate can be configured such that it can tilt a little in the event of non-vertically acting actuation/force action, and nevertheless transmits the force to the main body. The spring bracing has the effect that after deflection the actuation plate orients itself again parallel to the base or parallel to the main surface of the main body.

In an alternative embodiment, the main body is fixed by way of cymbal-shaped elements between the base and the actuation plate, wherein a spring pressure acting in the direction of the base is exerted on the actuation plate. Said spring pressure can be generated by means of helical springs supported at a clip that is secured to the base and arranged such that it is situated with a clip end vertically above the main body. The clip can also be a rail having for example a doubly bent cross-sectional profile. A lower flat part can be secured on the base, while the upper flat part is situated above the main body. Instead of a clip, the holding element can also be configured as a sleeve having a flanged edge, wherein the sleeve then simultaneously constitutes a guide for the linear expansion of the entire device. In this case, the helical springs under compression stress between sleeve or clip and actuation plate bring about secure mounting and return to an initial position after actuation of the device or after deflection of the piezoelectric actuator.

Furthermore, the cymbal-shaped element comprises a lateral surface projecting above the respective main surface in the direction of the normal. The cymbal-shaped element comprises a cover surface at the truncated cone vertex, which cover surface is oriented approximately parallel to the surface of the main body.

The cymbal-shaped element therefore preferably comprises a round basic area, with the aid of which changes in length parallel to the main surface, independently of the angle with respect to the main body, can be taken up in the best way and can be amplified by deformation of the metal sheet in a direction parallel to the normal.

The device according to the invention generates haptic feedback if a force exerted on the main body or the device is identified. The identification can take place with the aid of the inverse piezoelectric effect. The force exerted on the main body comprising actuator electrodes generates a charge transfer that can be tapped off as measurement voltage at electrodes. In principle, the actuator electrodes can be used for this purpose.

It is also possible, however, to arrange at least one separate measurement electrode in the main body and to use said measurement electrode to detect the measurement voltage that is generated by the exerted force on account of the inverse piezoelectric effect. Since the measurement voltage rises as the exerted force increases, a threshold value assigned to the desired trigger force can be defined for the measurement voltage to be detected. If the exerted force reaches the trigger force and the measurement voltage exceeds the threshold value in the process, then this is identified by a measuring unit connected to the measurement electrodes. Upon the trigger force being reached, by means of a voltage generator, an actuator voltage is then generated and applied to the actuator electrodes. At the same time a further action is triggered, which serves for operation of the device or of an electrical component connected thereto.

The device thus constitutes in practice a switch whose trigger point can be set by way of the threshold value. At the same time the switch generates haptic feedback from which the user who exerts the force by means of a finger pressure, for example, recognizes that the trigger force has been reached and thus recognizes the switching process. It is also possible to define a plurality of threshold values and to generate different haptic feedback by means of a control, such that different trigger forces can be identified, converted into different actions and communicated to the user by way of distinguishable feedback.

As stated, the actuator electrodes can serve as measurement electrodes. A third electrode can also be used as measurement electrode and the measurement voltage can be tapped off between the measurement electrode and an actuator electrode. However, it is also possible to provide two separate measurement electrodes in the main body.

The at least one measurement electrode that is different than the actuator electrodes can be arranged centrally in the main body between first and second actuator electrodes. However, it is also possible to arrange the at least one measurement electrode in the vicinity of one of the two main surfaces, such that all other first and second actuator electrodes are arranged on the same side of the measurement electrode in the main body.

The distance between the measurement electrodes or between the electrodes used as measurement electrodes, at least one of which can be an actuator electrode, can advantageously be chosen to be greater than the distance between the electrodes exclusively used as first and second actuator electrodes. If a distance provided between the measurement electrodes, between which, after all, a piezoelectric material is likewise arranged, is greater than a distance provided between the pure actuator electrodes, then the same acting force generates a higher voltage at the piezoelectric element arranged between the measurement electrodes than at the piezoelectric element between the actuator electrodes. A higher generated measurement voltage has the advantage that a lower threshold value assigned to the trigger force can be detected for the measurement voltage.

In order to generate a perceptible deflection, a device according to the invention requires a specific number of piezoelements stacked one above another and arranged alternately between first and second actuator electrodes. In this regard, a piezoelement is formed in each case between a first and a second actuator electrode. By way of the number of piezoelements, for the same total height of the main body or for the same total layer thickness of the individual piezoelements, it is possible to set the actuator voltage required for achieving a specific linear expansion. A large layer thickness between two actuator electrodes requires a high voltage for the deflection. Many small, stacked piezoelements require a lower voltage and nevertheless generate the same expansion if the total height of the piezoelectrically effective layers is matching.

First and second actuator electrodes are preferably arranged alternately and are connected outwardly in each case to an external contact arranged for first and second actuator electrodes at different sides of the main body. The actuator voltage can then be applied to the two external contacts.

The at least one measurement electrode can also be connected to an external contact in a corresponding manner. In order to identify the exerted force, however, a single piezoelectric element is sufficient, between the two electrodes of which the measurement voltage arises on account of the inverse piezoelectric effect.

A main body used in the device according to the invention has a dimension in the direction of its normal which is small relative to the dimension vertically with respect thereto. A flat main body is thus involved.

By way of example, the maximum extent of the main body in a direction perpendicular to the normal can be more than ten times the magnitude of the height of the main body as measured in the direction of the normal. The length of the main body can exceed the height of the main body even by a factor of 20 or more.

The linear expansion of the main body on account of the piezoelectric effect is relatively small and amounts to only approximately 0.1 percent of the total piezoelectrically effective height. The extent of the linear expansion in the direction of the normal is amplified by the cymbal-shaped elements.

The total expansion of the device according to the invention can be amplified further if a plurality of devices are stacked one above another. In other words, a number of two or more main bodies are stacked one above another, said main bodies being provided in each case with a cymbal-shaped element on the main surfaces. Preferably, the main bodies with the cymbal-shaped elements are fixed between an actuation plate and a base by means of helical springs. The springs can be under tensile or compressive stress and therefore pull or push the actuation plate in the direction of the base. In the case of a plurality of main bodies stacked one above another, the actuation plate is particularly advantageous since it simultaneously constitutes an improved mounting for the main bodies and lateral tilting of the stack of different main bodies one above another is thus prevented.

It is even better and more advantageous, however, if the main bodies stacked one above another are guided in a kind of sleeve in which the actuation plate can move freely in the direction of the normal. A flanged edge of the sleeve at that side of the sleeve which is removed from the base can serve simultaneously to clamp in between the edge and the actuation plate a spring that is under compressive stress. In the sleeve, however, the actuation plate can move even under prestress by means of a helical spring under tension. The abovementioned projecting upper edge of the sleeve can serve as a stop for the linear expansion parallel to the normal.

The device according to the invention can be configured as an actuation knob that can be used to switch a function of an electrical component. The switching process then takes place upon the defined trigger force being reached and identified, wherein the switching process is carried out either directly by the measuring unit or by a control unit connected thereto. The control unit can also comprise the voltage generator.

The invention is explained in greater detail below on the basis of exemplary embodiments and with reference to the associated figures. In this case, the figures are depicted merely schematically and are not true to scale. Individual dimensions may therefore be illustrated in an enlarged or reduced manner in order to afford a better understanding.

Figure 1:
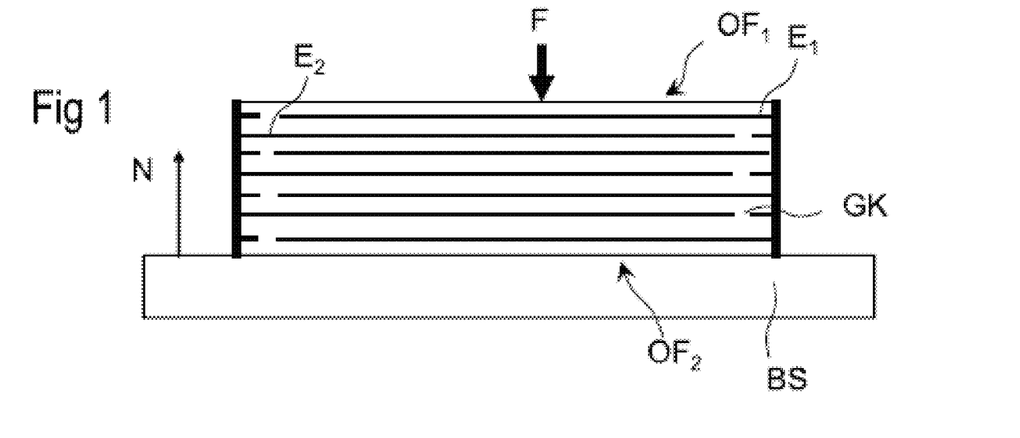
FIG. 1 shows a main body functioning as an actuator in schematic cross section.

FIG. 1 shows a simple piezoelectric main body GK having a first and a second actuator electrode E1, E2. The main body GK is produced for example in the form of stacking one above another piezoelectric layers which have been or are printed in each case with electrode material. The layers are preferably used as ceramic green sheets and printed with an electrode paste that can be fired for the actuator electrodes. After a desired quantity of layers have been stacked one above another, they are finally sintered jointly to form a monolithic block—the main body. The actuator (=main body with actuator electrodes) comprises a piezoceramic, for example on the basis of PZT (lead zirconate titanate). The PZT ceramic can furthermore additionally contain Nd and Ni. Alternatively, the PZT ceramic can furthermore additionally comprise Nd, K, and if appropriate, Cu. Alternatively, the piezoelectric layers can have a composition containing $Pb(Zr_xTi_{1-x})O_3$+y $Pb(Mn_{1/3}Nb_{2/3})O_3$. The piezoelectric layers can be polarized such that the change in length of the main body is brought about by an AC voltage being applied between the first and second internal electrodes and the piezoelectric effect associated therewith.

The main body is arranged on a base BS, which forms for example a surface of an electrical component. The stacking direction of the individual layers corresponds to the surface normal N of the main body. The force F exerted on the piezoactuator acts with its component acting vertically with respect to the surface or parallel to the normal N. Only this force is converted into an electrical voltage that can be tapped off at the actuator electrodes E1, E2, or at measurement electrodes, which are not illustrated in the figure.

In order to generate the haptic feedback, an actuator voltage is applied between first actuator electrode E1 and second actuator electrode E2, said actuator voltage leading to a change in length of the main body GK. By means of corresponding polarization of the piezoelectric main body, the change in length brought about as a result can take place parallel to the normal, that is to say in the opposite direction to the exerted force F, such that it can be perceived in the best way by a user.

Figure 2:
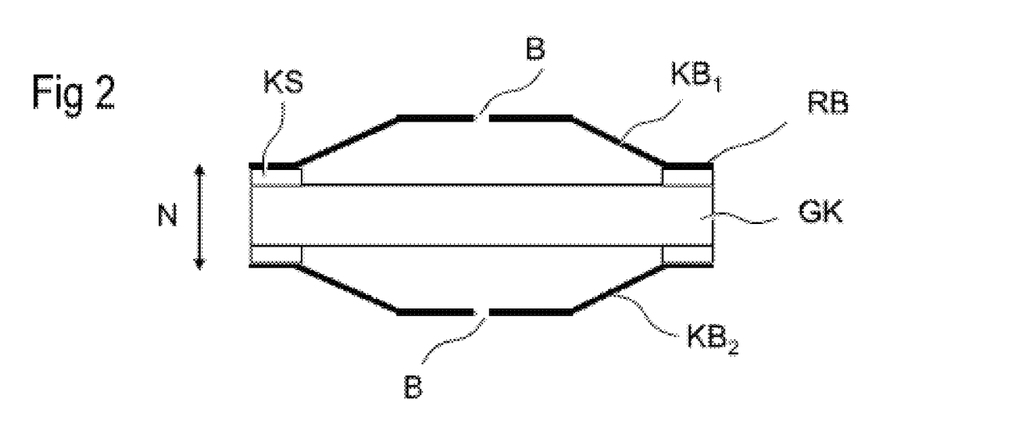
FIG. 2 shows a main body provided with adhesively bonded cymbal-shaped elements.

FIG. 2 shows, on the basis of a schematic cross section, how it is possible to amplify the linear expansion of the entire device in the direction of the normal. A respective cymbal-shaped element KB1, KB2 configured as a truncated-cone-shaped metal sheet is mounted on both main surfaces of the main body GK. For this purpose, an edge region which is embodied in flat fashion and which can bear in flat fashion on the main surface of the main body GK is fixedly connected to the latter. The edge region is adhesively bonded on the main body GK by means of an adhesive layer KS. Preferably, the cymbal-shaped element is adhesively bonded on the main body by means of an adhesive layer KS which is closed in a ring-shaped fashion and extends around the entire edge region of said cymbal-shaped element. An epoxy-containing adhesive that is thermally curable is preferably used for adhesive bonding. The curing can then take place for example at approximately 150° C.

As a result of the special shaping, in particular as a result of the lateral surfaces and the cover surface of the truncated cone, a transverse contraction of the main body GK is converted directly into a deformation of the cymbal-shaped element which proceeds parallel to the normal N.

A cymbal-shaped element is adhesively bonded on one or preferably both of the main surfaces. Each cymbal-shaped element comprises a preferably centrally arranged hole in order that pressure equalization between the cavity enclosed below the cymbal-shaped element and the surroundings becomes possible. The hole has a sufficient diameter of e.g. 0.1 mm to 0.7 mm, preferably 0.3 to 0.5 mm.

The metal sheet of the cymbal-shaped element can comprise titanium or consist of titanium as material. Titanium has significant advantages in particular for the present application here of the device for generating active haptic feedback. In addition, titanium has a coefficient of thermal expansion that is very close to the coefficient of thermal expansion of the main body. As a result, the point of connection of the metal sheet to the main body is not subjected to significant mechanical loading in the event of a change in temperature. By way of example, both the metal sheet and the main body can have a coefficient of thermal expansion of between 8 and 9 ppm/K.

Figure 3A:
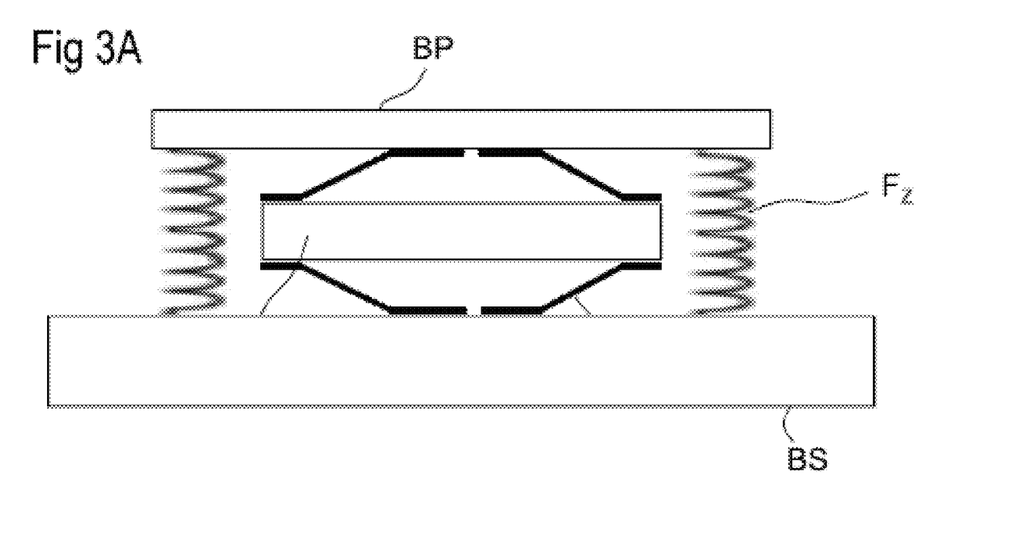
FIG. 3A shows a main body braced between an actuation plate and the base by means of tension springs.

FIG. 3A shows one embodiment of the device according to the invention in which the piezoactuator or the main body GK with the two cymbal-shaped elements KB1, KB2 is fixed between the base BS and an actuation plate BP. The fixing is effected by helical springs $F_Z$, which are under tensile stress and with the aid of which the actuation plate BP is pulled in the direction of the base BS and thus fixes the main body GK. In this way, the ceramic main body GK can move in an unimpeded manner and a rigid securing of the ceramic of the main body to the base BS or to a surface to be moved can be obviated. This allows the transmission capability of the two truncated-cone-shaped cymbal-shaped elements KB to be fully utilized and here at the same time reduces the risk of the ceramic or the main body being damaged. As a result of the bracing by means of the springs FZ, a direct contact of the truncated-cone-shaped metal sheets with the actuation plate and/or with the base BS is always guaranteed and ensured over the lifetime and for the operating conditions under which the device is operated.

The actuation plate BP is formed for example in rectangular fashion and from aluminum. It has a mechanical stability or thickness that is sufficient for the acting forces. However, it can also be formed from other materials, e.g. from metal, plastic, ceramic, glass or wood. In this case, it is formed such that the haptic feedback can be transmitted as far as possible without disturbances or without damping. This presupposes a material having a certain hardness or a high modulus of elasticity.

The actuation plate BP has a larger basic area than the main body GK and projects beyond the edge thereof preferably on all sides. A secure fixing is achieved with at least two springs $F_Z$. It is advantageous, however, to use a higher number of springs $F_Z$ in order to enable a symmetrical bracing. The springs $F_Z$ are then distributed uniformly over the circumference of the actuation plate.

Figure 3B:
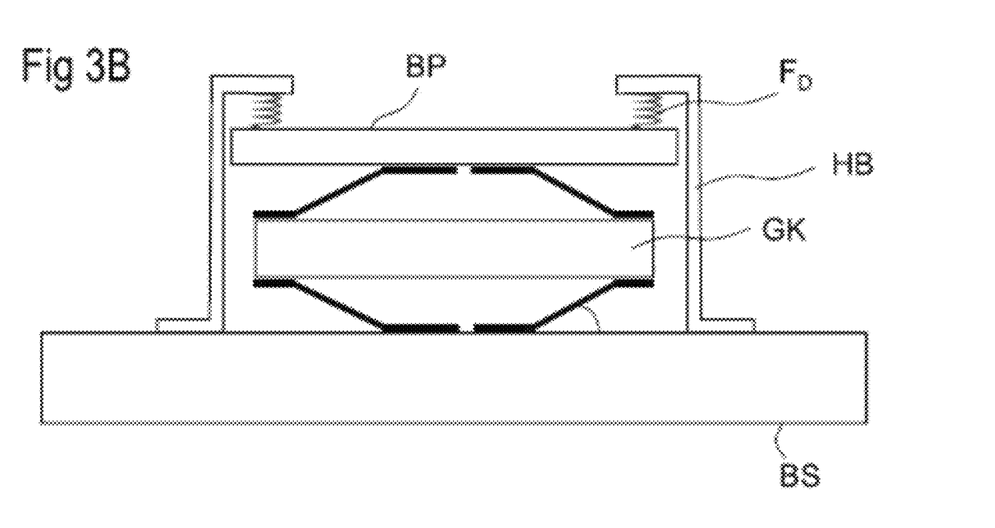
FIG. 3B shows a main body braced between an actuation plate and the base by means of compression springs.

Advantages similar to those afforded by the embodiment according to FIG. 3A are afforded by a further embodiment in accordance with FIG. 3B. In this embodiment, the main body GK with the two cymbal-shaped elements KB is likewise fixed under pressure between the actuation plate BP and the base BS, wherein the pressure for fixing acts on the actuation plate BP from above, however, with the aid of helical springs $F_D$. The helical springs $F_D$ are clamped in between the actuation plate and holding clips HB under compressive stress. The holding clips HB project over the actuation plate BP and form an attachment point there for the springs $F_D$.

FIG. 3B illustrates the clip in cross section. An individual holding clip can be used per spring. It is advantageous, however, to use a clip strip having a cross section as illustrated in FIG. 3B or similar thereto, at which a plurality of springs $F_D$ can engage.

It is even better if the rail that forms the holding clip HB in cross section extends all around the actuation plate, such that the actuation plate is held virtually as in a sleeve with the holding clip open. This embodiment has the advantage that a secure retention is still ensured even in the event of great deflection. While the springs $F_Z$ under tensile stress in the embodiment in accordance with FIG. 3A may possibly be overextended, which leads to a weaker or decreasing fixing, with the embodiment according to FIG. 3B a stop is provided by means of the holding clip HB, which stop prevents the actuation plate BP from moving away upward to an excessively great extent.

Figure 4:
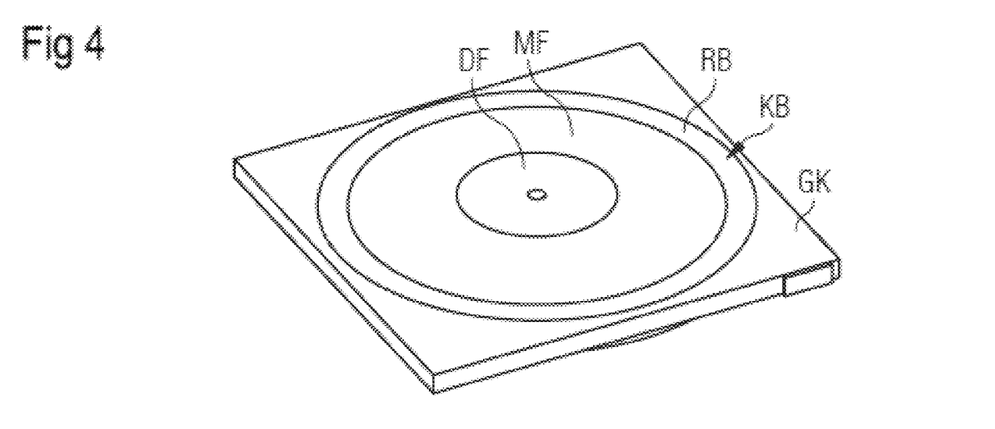
FIG. 4 shows a spatial illustration of a device according to the invention in plan view.

FIG. 4 shows a three-dimensional illustration of a device according to the invention in oblique plan view. The main body GK advantageously has a square basic area, wherein the truncated-cone-shaped metal sheet KB has a round basic area secured by its edge region centrally on the surface of the main body GK. In the region of the lateral surface MF, the truncated-cone-shaped metal sheet extends upward and tapers radially, such that the cover surface DF likewise has a round basic area. The cover surface DF can be planar, but can have a finger-shaped depression facing in the direction of the main body in order to adapt to a user's finger shape.

Figure 5:
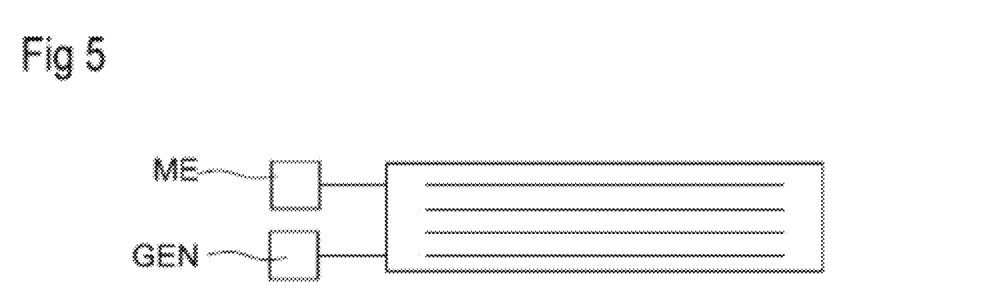
FIG. 5 shows main body with measuring unit and generator.

FIG. 5 shows a main body GK in schematic cross section. The illustration shows the actuator electrodes E1, E2, which are oriented as internal electrodes parallel to one another and parallel to the main surfaces of the main body at equal distances from one another. The illustration does not show a specific measurement electrode, which can be at a greater distance from the adjacent actuator electrode. The illustration likewise does not show the connection of the actuator electrodes to external contacts via which the actuator electrodes can be interconnected in parallel. For this purpose, the internal electrodes can be lengthened in web-shaped fashion as far as the edge of the main body and make contact there with one of the two connection contacts. This leading of the internal electrodes out to the edges of the main body GK is effected alternately for first and second actuator electrodes toward different connection contacts, such that all first and second actuator electrodes can be contacted via a total of two connection contacts.

At least two of the internal electrodes of the main body are connected to a measuring unit ME, which can identify an electrical voltage which acts as a result of a force being exerted vertically on a main surface of the main body and is generated by the inverse piezoelectric effect in the piezoelectric ceramic. A voltage generator GEN is connected to the two external contacts of first and second actuator electrodes E1, E2. If the measuring unit ME identifies that a trigger force has been reached, which is manifested in the exceedance of the generated measurement voltage, the voltage generator GEN generates an actuator voltage and applies it to first and second actuator electrodes. The latter in turn lead to the deflection of the main body, which is identified by the user as haptic feedback.

In order to amplify the perception, the voltage applied to the actuator electrodes can be modulated in the form of different, successive pulses. The sequential frequency thereof is then chosen such that the feedback can be perceived by the user as a vibration. It is also possible to apply an AC voltage of suitable frequency to the actuator electrodes. Furthermore, it is possible for a plurality of threshold values to be defined in the measuring unit and the control unit connected thereto, which threshold values can then generate different feedbacks. Different feedbacks can differ in the frequency or generally in the length, sequential frequency or number of the pulses. In parallel therewith the device can then trigger different actions depending on the threshold value reached.

Figure 6A:
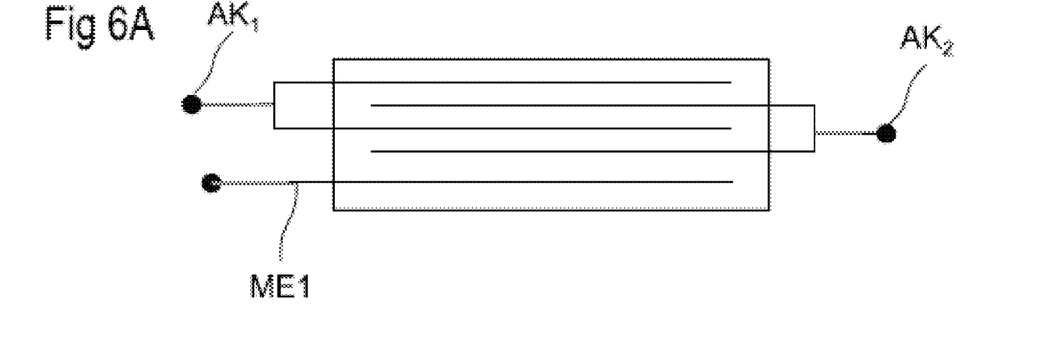
FIGS. 6A and 6B show two different arrangements of actuator electrodes and measurement electrodes on the basis of a schematic cross section through the main body.

FIG. 6A shows one possible arrangement of the measurement electrode ME1 in the main body GK such that all actuator electrodes are arranged on one side of the measurement electrode ME1. The measurement electrode ME1 can then be arranged in the vicinity of a main surface of the main body GK.

Figure 6B:
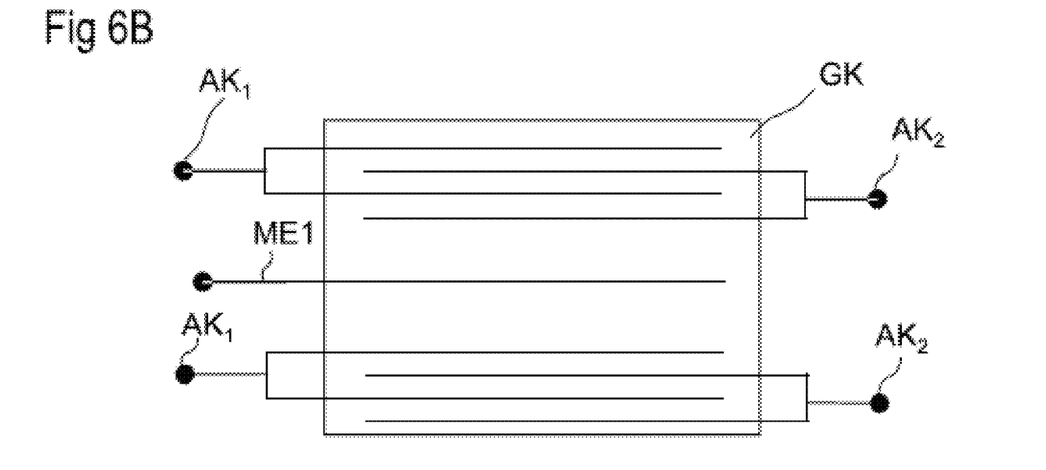

FIG. 6B shows, on the basis of a schematic cross section, how the measurement electrode ME1 is arranged in the center of the main body GK between the actuator electrodes E1, E2. A distance provided between measurement electrode ME1 and actuator electrode E2 can be greater than a distance provided between actuator electrodes E1, E2 of different polarities. The first actuator electrodes E1 are connected to a first external contact Ak1, and the second actuator electrodes E2 are connected to a second external contact AK2.

Figure 7:
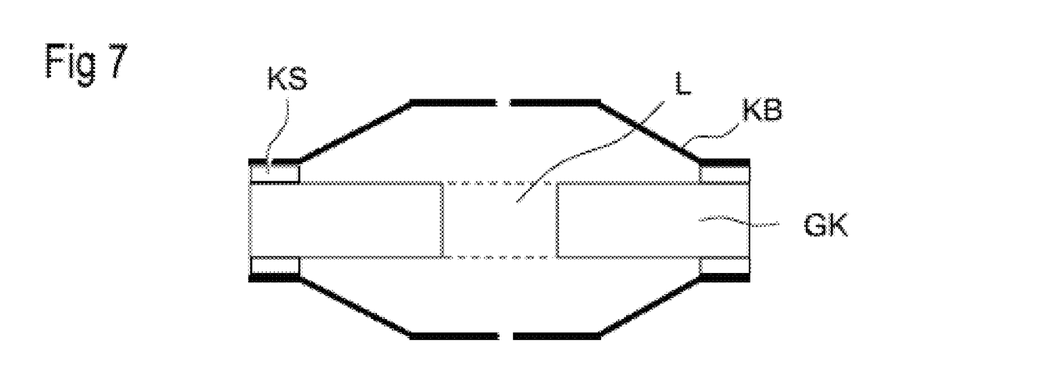
FIG. 7 shows a device according to the invention comprising a main body perforated by a through hole.

FIG. 7 shows a further embodiment of the invention, in which the ceramic main body GK, that is to say the piezoelectric material of the main body, is perforated in the center, preferably in the form of a continuous cylindrical hole L. The edge region of the truncated-cone-shaped metal sheet KB is adhesively bonded onto the main surfaces of the main body at a sufficient distance from the edges of the hole. The hole has the advantage that it reduces the capacitance of the piezoelectric actuator that builds up between the actuator electrodes, and the function of the actuator thus becomes possible with lower power with linear expansion of unchanged magnitude.

Figure 8:
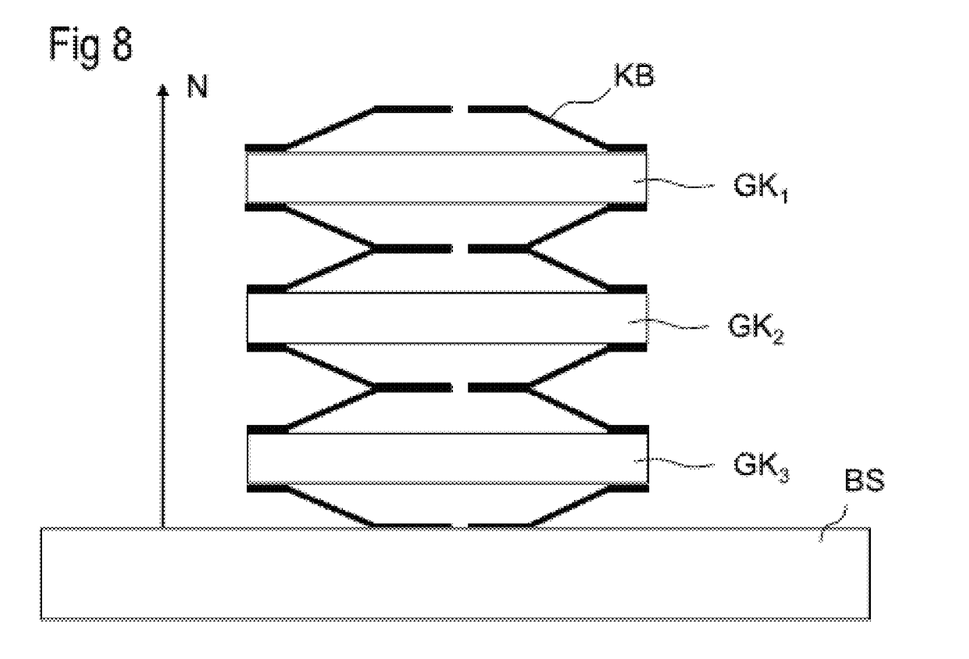
FIG. 8 shows a device according to the invention in which a plurality of main bodies are stacked and fixed one above another.

FIG. 8 shows a further embodiment, in which a plurality of devices comprising main bodies GK provided in each case with two truncated-cone-shaped metal sheets KB are stacked vertically one above another, such that the side edges of all the main bodies are aligned with one another, that is to say that the basic areas overlap to the extent of 100 percent. Although not illustrated, it is particularly advantageous in this embodiment for a fixing of these devices stacked one above another to be fixed against the base BS with the aid of an actuation plate and with helical springs, the stack bearing on said base. It is advantageous here also to fix the main bodies laterally by means of holding clips, or to limit their lateral slipping by means of appropriately close holding clips or other stops. In this way, too, what is ensured is that the main bodies are maximally movable, that the linear expansion is not hampered and that the linear expansion of the individual devices cumulates additively to form a total deflection parallel to the normal N vertically above the surface of the base B.

Figure 9:
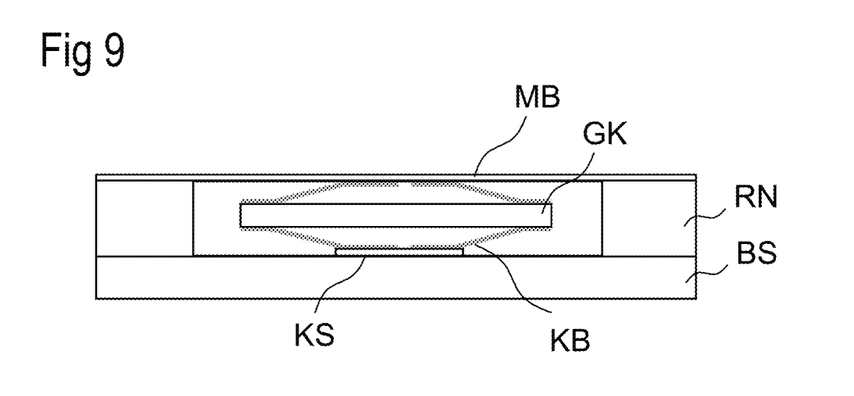
FIG. 9 shows a device according to the invention comprising a main body, wherein a membrane is braced above the upper cymbal-shaped element.

FIG. 9 shows a further exemplary embodiment of a device according to the invention comprising a main body GK. A membrane MB is braced above the upper cymbal-shaped element. Said membrane is embodied in thin and flexible fashion. As a result of this bracing and the elasticity, the membrane exerts a force which acts against the base BS and which corresponds to a spring force. The membrane MB constitutes the surface which is visible and operable for the user. This has the advantage that the operating surface has no gaps.

Membrane and base are fixedly connected to one another. This can be effected e.g. by means of a screw connection (not illustrated in the figure). The membrane can also be tensioned by means of a frame RN fixed on the base. A planar operating surface is thus obtained. At the same time the thin membrane guarantees that the haptic feedback is not weakened by the membrane. By contrast, the base is configured is as a stiff body.

The construction shown ensures that upon actuation of the device, exclusively the membrane is deformed and the intensity of the haptic feedback for the user is thus maximized. In addition, the spring effect of the membrane can be optimized by varying the thickness or the connection between membrane MB and base BS.

The membrane is advantageously configured such that it has a stiffness that is in the range 1%-50% of the stiffness of the actuator.

In order to prevent the actuator from slipping during operation, said actuator can additionally be secured to rear wall (and/or membrane). One possible manner of securing is the fixing of the actuator by means of an adhesive layer KS.

Besides the embodiment comprising a main body GK having a rectangular or square basic area as illustrated in particular in FIG. 4, it is also possible to embody the main body with a round basic area. The square or rectangular embodiment only has advantages in terms of process engineering if the main body is cut out from a stack of larger area, which is carried out by means of straight cuts that lead to rectangular or square main bodies. Accordingly, a main body can have a side length of between 10 and 30 mm, which can also correspond to the dimensions of a main body embodied in round fashion. The main body can have a height of between 0.5 and 2 mm in the direction of the normal.

The cymbal-shaped element KB can be dimensioned such that the distance between the central region of the cover surface DF and the surface of the main body GK is approximately 0.5 mm if no force is exerted on the component and if no voltage is present between first and second actuator electrodes.

The construction of the device is preferably symmetrical, such that upper and lower truncated-cone-shaped metal sheets are symmetrical with respect to one another in terms of their dimensions and arrangements. The cymbal-shaped element KB has a maximum horizontal extent relative to the basic area of the main body, such that a maximum surface area is enclosed within the edge region bearing on the main surface of the main body. The actuator volume arranged between the two metal sheets is then also maximal. This makes it possible maximally to detect a transverse contraction or to convert it into the desired deflection with maximum intensity.

The invention has been able to be represented only on the basis of a few exemplary embodiments and is therefore not restricted to the exact embodiment in accordance with the exemplary embodiments. It lies within the scope of the invention to vary as desired the number of actuator electrodes, the number of connection contacts or the number of main bodies stacked one above another. The shaping of the basic area is, to a first approximation, also not relevant to the effectiveness of the device. The haptic feedback can be realized in a desired manner and the deflection can be modulated accordingly. Furthermore, the trigger force can be set virtually arbitrarily, such that either only a slight touch through to a fixed pressure may be required for reaching the desired trigger force.

LIST OF REFERENCE SIGNS

AA Actuator deflection
AK External contact

B Hole
BS Base
BP Actuation plate
DF Truncated cone vertex=cover surface
E1, E2 first and second actuator electrodes
F force exerted on the actuator
$F_D$, $F_S$ Spring having compressive or tensile prestress
GEN Voltage generator
GK Piezoelectric main body
HB Holding clip
KB Truncated-cone-shaped metal sheet/cymbal-shaped element
KS Adhesive layer
L Hole in main body
ME Measuring unit
ME1, ME2 first and second measurement electrodes
MF Lateral surface of the metal sheet
MN Membrane
N Normal to the main surface
$OF_1$, $OF_2$ Main surfaces of the main body
RB Edge region of the metal sheet
RN Frame

The invention claimed is:

1. A device for generating active haptic feedback,
comprising a piezoelectric actuator having a flat piezoelectric main body having plane-parallel main surfaces in an xy plane and first and second actuator electrodes,
having a first and a second cymbal-shaped elements, each shaped as a truncated-cone-shaped metal sheet, said first and second cymbal-shaped elements being fixedly adhesively bonded on opposing main surfaces,
wherein the truncated cone vertex of each of the cymbal-shaped elements faces away from the main body,
wherein a cavity is enclosed between the cymbal-shaped elements and the main body,
wherein a hole is provided in the cymbal-shaped element, said hole enabling pressure equalization between the cavity and the surroundings,
wherein the actuator is fixed by truncated cones of the first and second cymbal-shaped elements between a base and a securing plate, wherein the securing plate in turn is connected to the base and is fixed by a prestress that can act as a tensile or compressive stress,
wherein a measurement electrode is arranged in the main body,
wherein a measuring unit is provided for measuring a measurement voltage which is generated between the measurement electrode and one of the actuator electrodes and which arises on account of a force exerted on the main body, and
wherein the device is configured to identify this exerted force as soon as the measurement voltage detected by the measuring unit exceeds a threshold value assigned to a trigger force, wherein a plurality of threshold values are defined such that different trigger forces can be identified,
wherein, upon the trigger force being reached, by a voltage generator, an actuator voltage is generated and applied to the actuator electrodes and in this case at the same time a further action is triggered, which serves for operation of the device or of an electrical component connected thereto, and
wherein different trigger forces are converted into different actions and communicated to the user by way of distinguishable feedback.

2. The device according to claim 1,
wherein at least one of the cymbal-shaped elements is shaped from a titanium metal sheet.

3. The device according to claim 1,
wherein at least one of the cymbal-shaped elements comprises a flat edge region oriented plane-parallel to the main surfaces of the main body, wherein the at least one cymbal-shaped element is adhesively bonded to the main body by way of its edge region.

4. The device according to claim 1,
wherein at least one of the cymbal-shaped elements is configured such that a deflection of the main body in the xy plane of the main surface forces a deformation of the at least one cymbal-shaped element, which results in a deflection in the z-direction and thus constitutes active haptic feedback to the deflection of the main body.

5. The device according to claim 4,
wherein at least one of the cymbal-shaped elements comprises a lateral surface projecting above the respective main surface in the direction of the normal,
wherein at least one of the cymbal-shaped elements comprises a cover surface at the truncated cone vertex, which cover surface is oriented parallel to the surface of the main body or comprises an anatomically adapted finger depression.

6. The device according to claim 1,
wherein the hole is arranged in a manner centered in the middle on the truncated cone vertex,
wherein the hole has a diameter of 0.1 to 0.6 mm.

7. The device according to claim 1,
wherein at least one of the cymbal-shaped elements is adhesively bonded on the main body by an epoxy adhesive.

8. The device according to claim 1,
wherein the actuator electrodes at the same time also constitute the measurement electrodes,
wherein the measuring unit is configured for determining the measurement voltage between the two actuator electrodes.

9. The device according to claim 1,
wherein a measurement electrode that is different than the actuator electrodes is arranged either centrally in the main body between first and second actuator electrodes or in the vicinity of one of the main surfaces, such that all first and second actuator electrodes are arranged on one side of the measurement electrode.

10. The device according to claim 1,
wherein the main body comprises a through hole extending parallel to the normal between the two main surfaces.

11. The device according to claim 1,
wherein a membrane is braced above at least one of the cymbal-shaped elements facing outward, which membrane fixes the first and second cymbal-shaped elements and thus also the actuator with a prestress acting in the direction of a base at the base.

12. The device according to claim 1,
configured as an actuation knob of an electrical component.

13. A device for generating active haptic feedback,
comprising a piezoelectric actuator having a flat piezoelectric main body having plane-parallel main surfaces in an xy plane and first and second actuator electrodes,
having a cymbal-shaped element shaped as a truncated-cone-shaped metal sheet, said cymbal-shaped element being fixedly adhesively bonded on one of the main surfaces, the truncated cone vertex of the cymbal-shaped element facing away from the main body, a cavity being enclosed between the cymbal-shaped element and the main body, a hole being provided in the cymbal-shaped element, said hole enabling pressure equalization between the cavity and the surroundings, a measurement electrode being arranged in the main body, a measuring unit being provided for measuring a measurement voltage which is generated between the measurement electrode and one of the actuator electrodes and which arises on account of a force exerted on the main body, wherein the device is configured to identify this exerted force as soon as the measurement voltage detected by the measuring unit exceeds a threshold value assigned to a trigger force, wherein, upon the trigger force being reached, by a voltage generator, an actuator voltage is generated and applied to the actuator electrodes and in this case at the same time a further action is triggered, which serves for operation of the device or of an electrical component connected thereto, and wherein a measurement electrode that is different than the actuator electrodes is arranged either centrally in the main body between first and second actuator electrodes or in the vicinity of one of the main surfaces, such that all first and second actuator electrodes are arranged on one side of the measurement electrode.

14. A device for generating active haptic feedback, comprising a piezoelectric actuator having a flat piezoelectric main body having plane-parallel main surfaces in an xy plane and first and second actuator electrodes, having a first and a second cymbal-shaped elements, each shaped as a truncated-cone-shaped metal sheet, said first and second cymbal-shaped elements being fixedly adhesively bonded on opposing main surfaces, wherein the truncated cone vertex of each of the cymbal-shaped elements faces away from the main body, wherein a cavity is enclosed between the cymbal-shaped elements and the main body, wherein a hole is provided in the cymbal-shaped element, said hole enabling pressure equalization between the cavity and the surroundings, wherein the actuator is fixed by truncated cones of the first and second cymbal-shaped elements between a base and a securing plate, wherein the securing plate in turn is connected to the base and is fixed by a prestress that can act as a tensile or compressive stress, wherein a measurement electrode is arranged in the main body, wherein a measuring unit is provided for measuring a measurement voltage which is generated between the measurement electrode and one of the actuator electrodes and which arises on account of a force exerted on the main body, and wherein the device is configured to identify this exerted force as soon as the measurement voltage detected by the measuring unit exceeds a threshold value assigned to a trigger force, wherein, upon the trigger force being reached, by a voltage generator, an actuator voltage is generated and applied to the actuator electrodes and in this case at the same time a further action is triggered, which serves for operation of the device or of an electrical component connected thereto, wherein a measurement electrode that is different than the actuator electrodes is arranged either centrally in the main body between first and second actuator electrodes or in the vicinity of one of the main surfaces, such that all first and second actuator electrodes are arranged on one side of the measurement electrode.

* * * * *